(12) United States Patent
De et al.

(10) Patent No.: US 7,463,079 B2
(45) Date of Patent: Dec. 9, 2008

(54) SHORT CIRCUIT PROTECTION BY GATE VOLTAGE SENSING

(75) Inventors: Sukumar De, Bangalore (IN);
Kamalesh Hatua, Shibpur-Howrah (IN);
Milan M R Rajne, Bangalore (IN)

(73) Assignee: Honeywell International Inc., Morristown, NJ (US)

( * ) Notice: Subject to any disclaimer, the term of this patent is extended or adjusted under 35 U.S.C. 154(b) by 53 days.

(21) Appl. No.: 11/429,345

(22) Filed: May 5, 2006

(65) Prior Publication Data
US 2007/0257725 A1 Nov. 8, 2007

(51) Int. Cl.
*H03K 17/30* (2006.01)

(52) U.S. Cl. ............ 327/379; 327/309; 327/381; 327/432; 361/91.1; 361/111

(58) Field of Classification Search ........... None
See application file for complete search history.

(56) References Cited

U.S. PATENT DOCUMENTS

| | | | |
|---|---|---|---|
| 4,680,664 A | 7/1987 | Leuthen | |
| 4,783,714 A | 11/1988 | Kalina | |
| 4,829,415 A | 5/1989 | Haferl | |
| 4,970,620 A | 11/1990 | Lehnhoff et al. | |
| 5,383,083 A * | 1/1995 | Shinoda et al. | 361/103 |
| 5,402,083 A | 3/1995 | Shekhawat et al. | |
| 5,422,593 A * | 6/1995 | Fujihira | 327/561 |
| 5,469,095 A | 11/1995 | Peppiette et al. | |
| 5,936,387 A * | 8/1999 | Tabata et al. | 323/225 |
| 6,057,728 A * | 5/2000 | Igarashi | 327/546 |
| 6,185,082 B1 * | 2/2001 | Yang | 361/90 |
| 6,271,709 B1 * | 8/2001 | Kimura et al. | 327/380 |
| 7,205,822 B2 * | 4/2007 | Torres et al. | 327/427 |
| 2002/0176215 A1 | 11/2002 | Hiyama et al. | |
| 2003/0180997 A1 | 9/2003 | Nakayama et al. | |
| 2004/0201935 A1 | 10/2004 | Yamamoto | |
| 2004/0207967 A1 | 10/2004 | Ohshima | |

* cited by examiner

*Primary Examiner*—An T Luu
(74) *Attorney, Agent, or Firm*—Schwegman, Lundberg & Woessner, P.A.

(57) ABSTRACT

A protection circuit monitors the gate voltage of an insulated gate bipolar transistor (IGBT) or metal oxide semiconductor field effect transistor (MOSFET) to protect the transistor during a time when it is being turned on. In one embodiment, the circuit monitors a transient gate voltage of the transistor when it is turned on. A short or overcurrent condition is detected when the gate voltage exceeds a delayed reference signal.

19 Claims, 4 Drawing Sheets

SHORT CIRCUIT PROTECTION BY GATE VOLTAGE SENSING

BACKGROUND

An insulated gate bipolar transistor (IGBT) or metal oxide semiconductor field effect transistor (MOSFET) needs to be protected against shorts and overcurrent conditions. Too large of a transistor current, defined as the current between collector and emitter in the case of IGBTs and the drain to source current in MOSFETs, can damage the transistor. Monitoring circuits have been used to measure a device voltage between the collector and emitter or source and drain in prior attempts to determine whether a short or overcurrent condition exists during an on state of the transistors. The monitoring circuits compare the device voltage to a reference voltage to enable the transistor to be turned off should the device voltage exceed the reference voltage. Such monitoring circuits are a last resort of protection when other lower level of protection circuits fail to protect the transistor from high current.

Immediately after turn on of these types of transistors, there may be considerable ringing on the collector or source due to parasitic capacitances and parasitic wiring inductance. The monitoring circuit is blanked during this period to allow the ringing to clear and prevent false tripping of IGBT activated by the monitoring circuit. The time duration between the instant the transistor is turned on and the activation of the monitoring circuit is referred to as a blanking time. The blanking time may vary from 1 to 4 μsec in various transistors. The transistor is not protected from shorts or overcurrent during this time, and may be damaged from high currents. Where such transistors are used in switching applications, where the transistors are turned on and off quickly, the blanking time can be a significant amount of time that the transistors are unprotected. There is a need to protect such transistors during the blanking time.

SUMMARY

A protection circuit monitors the gate voltage of an insulated gate bipolar transistor (IGBT) or metal oxide semiconductor field effect transistor (MOSFET) to protect the transistor during a time when it is being turned on. In one embodiment, the circuit monitors a transient gate voltage of the transistor when it is turned on. A short or overcurrent condition is detected when the gate voltage exceeds a delayed reference voltage.

DETAILED DESCRIPTION

In the following description, reference is made to the accompanying drawings that form a part hereof, and in which is shown by way of illustration specific embodiments which may be practiced. These embodiments are described in sufficient detail to enable those skilled in the art to practice the invention, and it is to be understood that other embodiments may be utilized and that structural, logical and electrical changes may be made without departing from the scope of the present invention. The following description is, therefore, not to be taken in a limited sense, and the scope of the present invention is defined by the appended claims.

An insulated gate bipolar transistor (IGBT) or metal oxide semiconductor field effect transistor (MOSFET) needs to be protected against shorts and overcurrent conditions. Too large of a transistor current, defined as the current between collector and emitter in the case of IGBTs and the drain to source current in MOSFETs, can damage the transistor. For convenience, the collector/emitter terminology related to IGBTs will be used in this description, and is meant to represent both IGBTs and MOSFETs.

Figure 1:
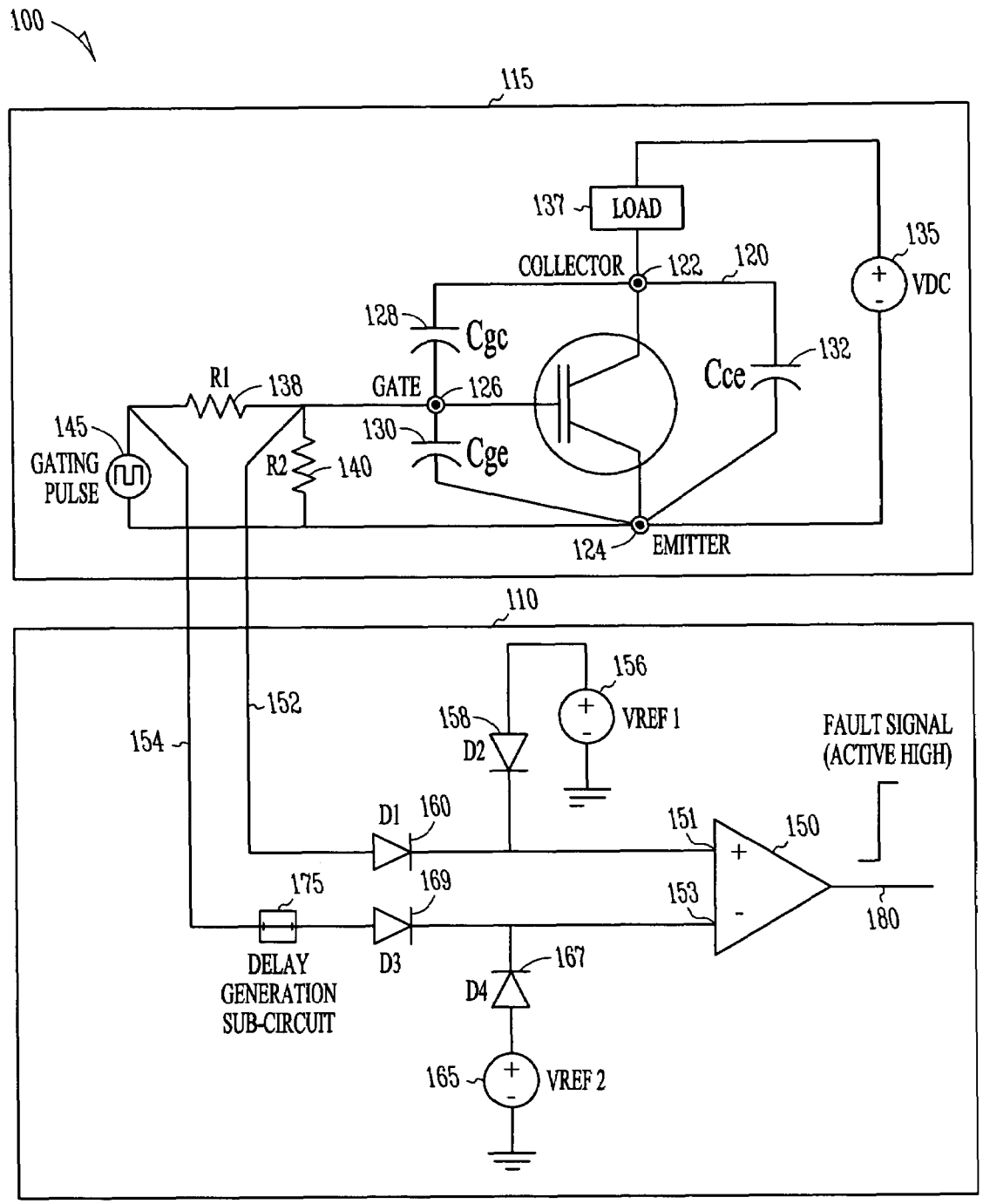
FIG. 1 is a circuit diagram of an overcurrent detection circuit according to an example embodiment.

FIG. 1 is a circuit diagram 100 of a short circuit protection circuit 110 that monitors IGBT gate voltage during turn on transient. The short circuit protection circuit monitors the gate voltage of the transistor and may be implemented along with regular Vce-monitoring circuitry, to protect the transistor against overcurrent and short circuit conditions. The protection circuit may be referred to as a Vge transient monitoring circuit. A circuit incorporating an IGBT as the transistor is indicated at 115, and should also be considered as representative of a MOSFET.

Circuit 115 comprises a transistor 120, such as an IGBT or MOSFET transistor. As mentioned above, terminology related to IGBTs, such as gate, collector and emitter will be used, but are equally applicable to MOSFETs, which commonly have gates, drains and sources. Transistor 120 has a collector 122, emitter 124 and gate 126. Multiple parasitic capacitances are represented by gate to collector capacitor Cgc 128, gate to emitter capacitor Cec 130 and collector to emitter capacitor Cec 132. The gate to emitter capacitor 130 and the gate to collector capacitor 128 significantly influence the transient switching voltage waveform profile at the gate 126 of transistor 120 when it is turned on.

The gate to collector capacitor, Cgc, also known as Miller Capacitor, has a capacitance that is a non linear function of the collector emitter voltage. The magnitude of this capacitance increases as the collector emitter voltage reduces during turn on. In a typical power IGBT, the capacitance value of the Miller capacitor, Cgc, can increase as high as 20 times when collector voltage reduces from 20V to the saturation voltage. Such high change in capacitance value allows detection of the presence of short circuit during transistor turn-ON. When the transistor is turned on against a short circuit the collector-emitter voltage does not reduce during turn on transient and hence the value of Miller capacitance does not increase. This leads to faster charging of the gate capacitor, Cge 130, which in turn leads to faster voltage rise at the gate 126 of transistor 120.

In one embodiment, a DC voltage source 135 and load 137 are connected across the collector 122 and emitter 124 of transistor 120. A short in the load 137 may result in an overcurrent, a current exceeding the safe operating limit of transistor 120. Examples of such a load 137 include a bridge inverter circuit, which may be used in power electronic applications like uninterruptible power supplies, motor drive, etc.

In one embodiment, the gate 126 is coupled to a gate resistor 138 and a second resistor 140 may be coupled between gate 126 and emitter 124. Gating pulses are provided through gate resistor 138 from a gating pulse generator 145. The second resistor 140 is coupled between the gate 126 and the emitter 124 to improve noise immunity of the transistor gate drive. The resistances of gate resistor 138 and second resistor 140 form a voltage divider network and ensure that the voltage at the gate terminal 126 is always lower than that of gating pulses provided by gating pulse generator 145.

Short circuit protection circuit 110 comprises a comparator 150 that compares a voltage across gate resistor 138 representative of the voltage at gate 126. The comparator 150 is used to detect abnormality in the transient gate voltage during turn on. A positive terminal 151 of comparator 150 is coupled via line 152 to the gate 126, and a negative terminal 153 of comparator 150 is coupled via a line 154 on the other side of gate resistor 138. The terminals of comparator 150 are also coupled to reference voltages. Positive terminal 151 is coupled to a first reference voltage Vref1 at 156 via a diode OR network comprising diodes 158 and 160. Negative terminal 153 is coupled to a second reference voltage Vref2 at 165 via a diode OR network comprising diodes 167 and 169. The voltage on line 154 at 170 just prior to diode OR network 167, 169 is delayed from gating pulse generator 145 by a delay circuit 175, which delays the rising edge of pulses by a specified time Dt.

Figure 2:
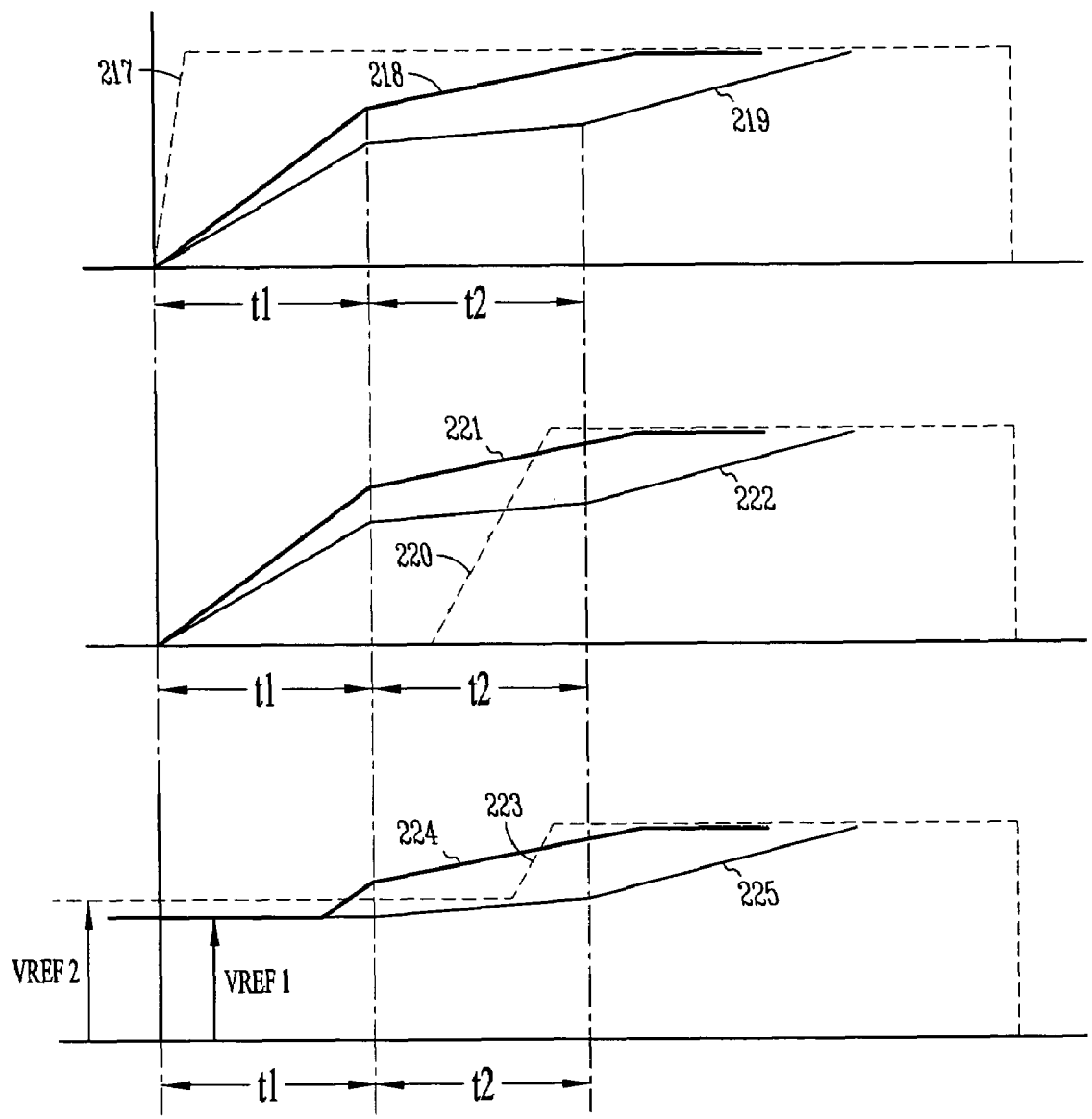
FIG. 2 is a timing diagram illustrating waveforms associated with normal and abnormal turn on conditions of a transistor in FIG. 1.

FIG. 2 includes three timing diagrams of voltages at various terminals of the circuit of FIG. 1 during normal turn on and abnormal turn on of transistor 120. A waveform 217 is representative of a gating pulse from gating pulse generator 145. Waveform 218 is representative of the gate 126 voltage during turn on in an overcurrent condition. Waveform 219 illustrates the voltage at transistor gate 126 under normal operating condition. It exhibits a plateau interval t2 during which the waveform is fairly flat or slightly rising. Waveform 218 is the gate voltage when the transistor 120 turns on against a short-circuit or overcurrent. Note that waveform 218 does not exhibit such a plateau region, but rises faster than a normal gate voltage during turn on.

Waveform 220 corresponds to the voltage at the output of delay generation sub-circuit 175 at 170. This waveform is similar to 217 except that it is delayed at the rising edge. The delay time may be adjusted between t1 and (t1+t2) in various embodiments. The values of t1 and t2 are characteristic of a specific transistor and also depend on load current passing through the transistor. However these values are generally of the order of few tens of nanoseconds. A fairly precise delay generation sub-circuit 175 may be used to provide such a delay. One example of the delay generation sub-circuit is delay-lines. Delay lines may be programmed to provide a desired fairly precise delay time. The delay generation sub-circuit may also be realized using simple R-C networks or by other methods. The exact value of the delay time may be designed to match transistor switching characteristics. Waveforms 221 and 222 are the same as waveforms 218 and 219, but are just drawn on a separate time axis for ease of viewing.

In the last time axis, wave form 223 corresponds to the voltage at negative terminal 153 of comparator 150. Waveforms 224 and 225 correspond to the voltage at positive terminal 151 of the comparator 150 during overcurrent and normal turn on conditions respectively. Waveforms 224 and 225 appear the same as waveforms 221 and 222 respectively except that their minimum voltage is limited to the value of Vref1 156. A voltage drop in the diodes 160 and 162 is considered to be zero for ease of discussion. The value of Vref1 may be designed to be a constant voltage equal to (or close to) the voltage of waveform 222 at time t1, i.e. at the beginning of the plateau. Waveform 223 is the voltage at negative terminal 153 of the comparator 150. Waveform 223 is the same as waveform 220 except that its minimum voltage is limited to the value of Vref2. Voltage drop in the diodes 167 and 169 are also considered to be zero for ease of discussion. The value of Vref2 may be designed to be a constant voltage equal to (or close to) the voltage of waveform 222 at time (t1+t2), i.e. at the end of plateau. Further, the value of Vref2 may be designed to be more than the value of Vref1. Observing the waveforms 223, 224, and 225 reveals that under normal operating condition, the voltage shown by waveform 225 at positive terminal 151 of the comparator 150 is always lower than that represented by waveform 223 at the negative terminal 153. However when the transistor 120 is turned on under short-circuit condition, the voltage shown by waveform 224 at positive terminal 151 of the comparator 150 exceeds the voltage represented by waveform 223 at the negative terminal 153. Thus a fault signal at the output 180 of comparator 150, remains zero during normal operating condition and goes high only when the transistor is turned on against a short-circuit or overcurrent.

The fault signal may be used in a gate drive circuit to turn off the transistor gate signals whenever the fault signal is high. The fault signal in FIG. 1 is an active high signal. To generate an active low fault signal, the signals at the positive and negative terminals of comparator 150 may be interchanged or an inverter may be used.

Figure 3:
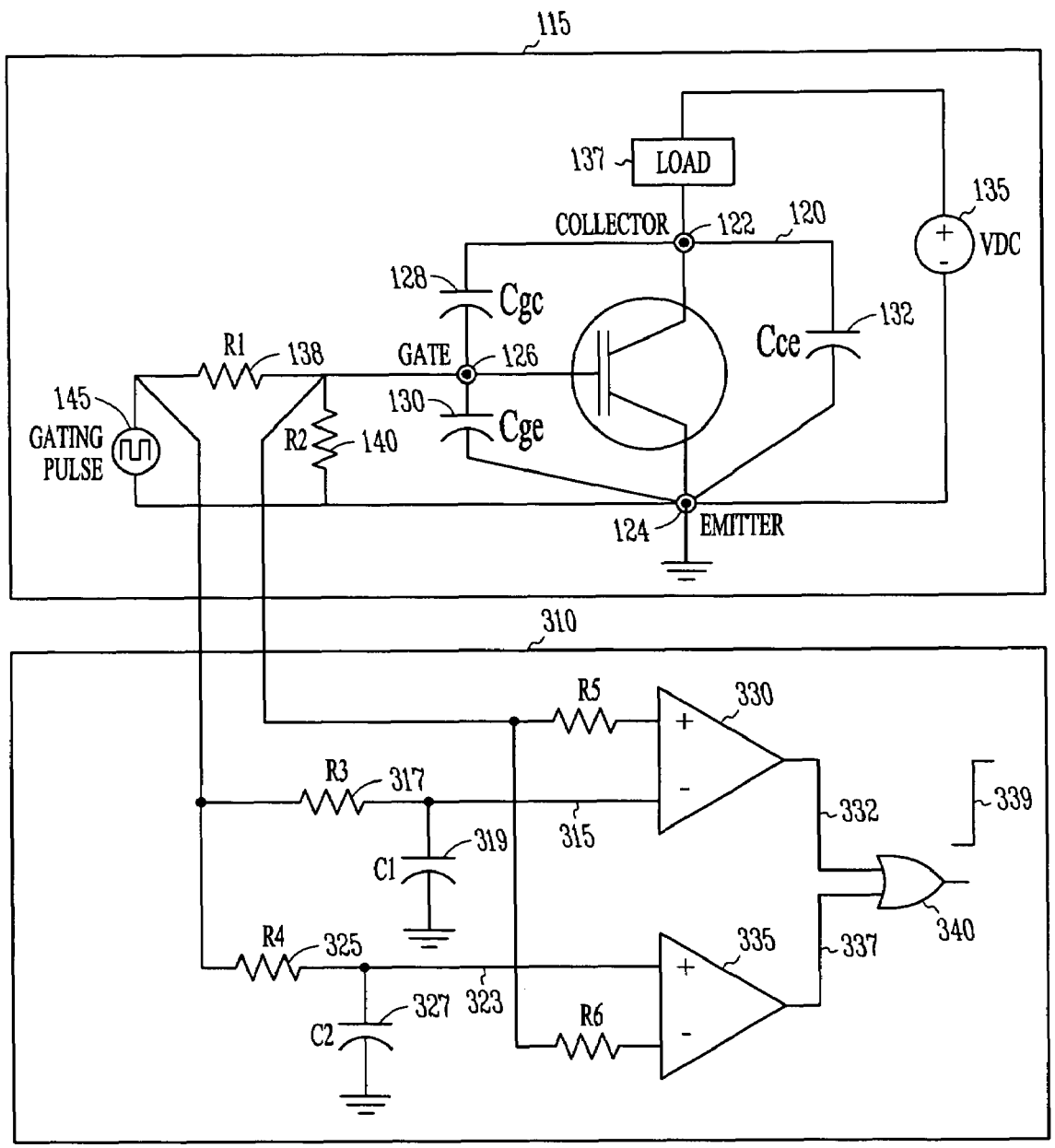
FIG. 3 is a circuit diagram of an alternative overcurrent detection circuit according to an example embodiment.

An alternative embodiment of a Vge transient monitoring circuit is shown at 310 in FIG. 3. In this embodiment, two reference voltage waveforms (called as voltage envelopes) are created from a voltage of the gating pulse from pulse generator 145. A reference voltage waveform V_upper_env at 315 is created using an RC network R3 at 317 and C1 at 319. A reference voltage waveform V_lower_env at 323 is created using an RC network R4 at 325 and C2 at 327. The gate 126 voltage is compared with V_upper_env in a first comparator 330. If the gate voltage is more than V_upper_env, the output 332 of the comparator 330 goes high. Similarly the gate 126 voltage is compared with V_lower_env in a second comparator 335. If the gate voltage is less than V_lower_env, the output 337 of the comparator 335 goes high.

The outputs of comparators 330 and 335 may be used as fault signals, which may be used in the gate drive circuit to turn off the transistor 120 gate signals, whenever any fault signal is high. One approach of getting a single fault signal 339 is by providing the outputs of the comparators to an OR gate 340. The single fault signal 339 may also be achieved by other analog means.

Selection of time constants for the R-C networks is a design consideration in this circuit 310. The time constant for the R-C network with R3 317 and C1 319 may be selected such that under normal turn on conditions, the instantaneous voltage at 315 is always higher than the gate voltage. Similarly the time constant for the R-C network with R4 325 and C2 327 may be selected such that under normal turn on conditions, the instantaneous voltage at 323 is always lower than the gate voltage. Part of the circuit consisting of R4 325, C2 327 and second comparator 335 are not required to detect any overcurrent or short circuit fault in the transistor 120. Thus, this part of the circuit is optional. However, this part of the circuit can detect certain abnormalities in the gate voltage profile due to some problem in the gate 126 of the transistor 120.

Figure 4:
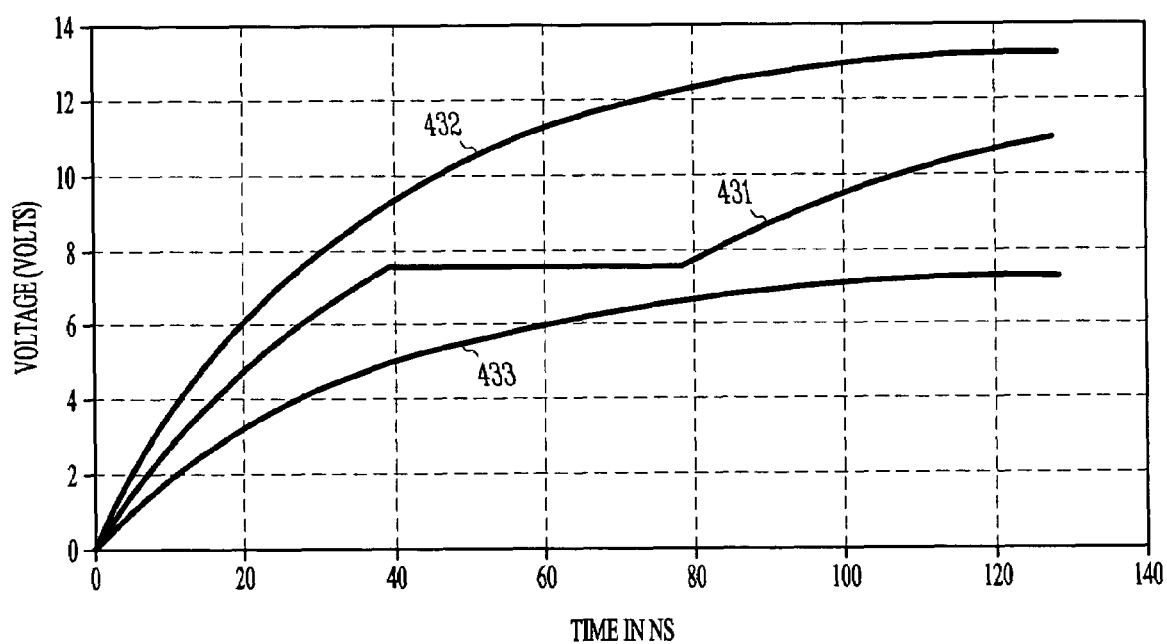
FIG. 4 is a timing diagram illustrating waveforms associated with normal and abnormal turn on conditions of a transistor in FIG. 3.

FIG. 4 is a timing diagram of various voltages in the circuit of FIG. 3. In FIG. 4, the gate voltage under normal operating condition corresponding to waveform 431 remains within the two voltage reference envelopes represented by waveforms 432 and 433. If the transistor 120 is switched on against a short circuit condition, the gate voltage 431 goes out of the reference envelopes 432 and 433.

Out of the multiple embodiments described, the circuit of FIG. 1 may be relatively more complicated. However, this circuit may have less variation with respect to environmental changes. The circuits of FIG. 3 are simple to design and implement.

The Vge transient monitoring circuits may be used along with popularly used "Vce-monitoring" circuits for full protection of IGBT against overcurrent. The Vge transient monitoring circuits may be shut off at the point Vce saturation is reached, and Vce-monitoring begins.

The Vge transient monitoring circuits create changing or increasing reference voltages during turn on of the transistor. One embodiment uses RC networks, while the first embodiment uses OR diode networks and a delay circuit to provide a changing reference voltage. In the second embodiment, RC time constants of the RC network are used to provide the delay. In further embodiments, many other means of delaying a reference voltage or increasing a reference voltage during turn on may be used.

The Abstract is provided to comply with 37 C.F.R. §1.72(b) to allow the reader to quickly ascertain the nature and gist of the technical disclosure. The Abstract is submitted with the understanding that it will not be used to interpret or limit the scope or meaning of the claims.

The invention claimed is:

1. A method comprising:
increasing a first reference voltage as a function of a gating pulse, wherein a first terminal of a comparator is coupled to the first reference voltage and to a gate of a transistor, and wherein a second terminal of the comparator is coupled to a second reference voltage; and
comparing, by using the comparator, a gate voltage of the transistor to the increasing first reference voltage during a transient turn on period to avoid false alerts, yet permit accurate overcurrent detection in the transistor,
wherein a delay circuit is coupled to the second reference voltage and to the second terminal of the comparator, and wherein the delay circuit delays the gating pulse that is provided to the gate of the transistor.

2. The method of claim 1 wherein a fault signal is generated if the gate voltage exceeds the increasing reference voltage during the transient turn on period.

3. The method of claim 1 wherein the gating pulse is delayed by a delay circuit.

4. The method of claim 1 wherein the transistor is an insulated gate bipolar transistor (IGBT) or metal oxide semiconductor field effect transistor (MOSFET).

5. A circuit comprising:
a comparator having a first terminal and a second terminal;
a first reference voltage coupled to the first terminal of the comparator, wherein the first terminal may be coupled to a gate of an insulated gate bipolar transistor (IGBT) or metal oxide semiconductor field effect transistor (MOSFET) transistor;
a second reference voltage coupled to the second terminal of the comparator;
a delay circuit coupled to the second reference voltage and to the second terminal of the comparator, wherein the delay circuit delays a gating pulse that is provided to the gate of the transistor.

6. The circuit of claim 5 wherein the second reference voltage is increased during turn-on of the transistor by a gate pulse that is delayed by the delay circuit.

7. The circuit of claim 5 wherein the comparator provides a fault signal when the gate voltage exceeds the second reference voltage.

8. The circuit of claim 5 wherein the second reference voltage is provided by a combination of a voltage source, a diode OR network, and the delayed gating pulse.

9. The circuit of claim 5 wherein the delay circuit comprises a delay line with a delay less than a turn on period of the transistor.

10. The circuit of claim 9 wherein the turn on period of the transistor comprises a time between turn on and a time when Vce saturation is reached.

11. The circuit of claim 5 wherein the fault signal is operative to turn off the transistor.

12. A circuit comprising:
a first comparator having first and second input terminals;
a first delay circuit coupled to the second input terminal and for coupling to a gating pulse generator that provides gate pulses to turn on a transistor, wherein the first input terminal is operative to couple to the gate of the transistor such that if a voltage of the gate exceeds a delayed gate pulse, the comparator generates a first fault signal.

13. The circuit of claim 12 wherein the first delay circuit comprises a first RC network.

14. The circuit of claim 13 wherein the time constant of the first RC network is operable such that an overcurrent condition of the transistor will result in a gate voltage that exceeds a voltage at the second input terminal of the first comparator.

15. The circuit of claim 13 wherein the first input terminal of the first comparator is a positive terminal and the second input terminal of the first comparator is a negative terminal.

16. The circuit of claim 12 and further comprising:
a second comparator having first and second input terminals;
a second delay circuit coupled to the first input terminal of the second comparator and for coupling to the gating pulse generator that provides gate pulses to turn on the transistor, wherein the second input terminal of the second comparator is operative to couple to the gate of the transistor such that if a voltage of the gate goes below the delayed gate pulse, the comparator generates a second fault signal.

17. The circuit of claim 16 wherein the second delay circuit comprises a second RC network.

18. The circuit of claim 17 wherein the time constant of the second RC network is operable such that an abnormality of the condition of the transistor may result in a gate voltage that is less than a voltage at the second input terminal of the second comparator.

19. The circuit of claim 16 and further comprising an OR gate coupled to the first and second comparators for generating a single fault signal should at least one of the first and second fault signals be generated.

* * * * *